(12) United States Patent
Komatsu et al.

(10) Patent No.: US 10,032,894 B2
(45) Date of Patent: Jul. 24, 2018

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Takuya Komatsu, Kofu (JP); Fumikazu Imai, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/414,711

(22) Filed: Jan. 25, 2017

(65) Prior Publication Data

US 2017/0271486 A1    Sep. 21, 2017

(30) Foreign Application Priority Data

Mar. 16, 2016 (JP) .................. 2016-053128

(51) Int. Cl.
| | |
|---|---|
| H01L 29/739 | (2006.01) |
| H01L 21/02 | (2006.01) |
| H01L 21/324 | (2006.01) |
| H01L 21/768 | (2006.01) |
| H01L 23/535 | (2006.01) |
| H01L 29/16 | (2006.01) |
| H01L 29/66 | (2006.01) |

(52) U.S. Cl.
CPC .... H01L 29/7395 (2013.01); H01L 21/02529 (2013.01); H01L 21/324 (2013.01); H01L 21/76895 (2013.01); H01L 23/535 (2013.01); H01L 29/1608 (2013.01); H01L 29/66333 (2013.01)

(58) Field of Classification Search
CPC .......... H01L 29/7395; H01L 29/66333; H01L 21/324; H01L 29/1608; H01L 21/0529; H01L 23/535; H01L 21/76895
See application file for complete search history.

(56) References Cited

U.S. PATENT DOCUMENTS

| | | | |
|---|---|---|---|
| 2009/0313907 A1* | 12/2009 | Can ................. | B82Y 30/00 51/308 |
| 2012/0132912 A1 | 5/2012 | Suekawa et al. | |

(Continued)

FOREIGN PATENT DOCUMENTS

JP    2015-109474 A    6/2015

*Primary Examiner* — Dung Le
(74) *Attorney, Agent, or Firm* — Rabin & Berdo, P.C.

(57) ABSTRACT

After a titanium nitride film is formed to cover an interlayer insulating film, a first nickel film is formed on a front surface of a silicon carbide base exposed in a contact hole, so as to extend on the titanium nitride film. Next, the silicon carbide base and the first nickel film are reacted by rapid thermal annealing at a temperature of 800 to 1100 degrees C. to form a nickel silicide film that forms an ohmic contact. Grains of the titanium nitride film are enlarged by the rapid thermal annealing, making a grain size of the titanium nitride film 20 nm to 50 nm. Thus, interstices of the grains of the titanium nitride film become smaller than before the rapid thermal annealing or are eliminated, enabling the intrusion of nickel from the first nickel film into the interstices of the columnar grains of the titanium nitride film to be suppressed.

6 Claims, 5 Drawing Sheets

(56) References Cited

U.S. PATENT DOCUMENTS

| | | | | |
|---|---|---|---|---|
| 2012/0248397 A1* | 10/2012 | Nakagawa | .............. | H01L 45/08 |
| | | | | 257/4 |
| 2013/0256623 A1* | 10/2013 | Kim | ................... | H01L 45/1233 |
| | | | | 257/4 |
| 2017/0025502 A1* | 1/2017 | Harada | ................. | H01L 29/417 |
| 2017/0170306 A1* | 6/2017 | Nakayama | .......... | H01L 29/7788 |

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2016-053128, filed on Mar. 16, 2016, the entire contents of which are incorporated herein by reference.

BACKGROUND OF THE INVENTION

1. Field of the Invention

The embodiments discussed herein relate to a silicon carbide semiconductor device and a method of manufacturing a silicon carbide semiconductor device.

2. Description of the Related Art

Among semiconductor devices conventionally used as power devices, those using silicon (Si) as a semiconductor material have become mainstream. Compared to silicon, silicon carbide (SiC) has a wider bandgap (hereinafter, wide gap semiconductor) and physical properties such as thermal conductivity that is 3 times that of silicon, critical electric field strength that is 10 times that of silicon, and electron drift velocity that is 2 times that of silicon. Therefore, the application of SiC for power devices capable of high temperature operation with low loss and for which the dielectric strength is high, is being researched.

Even among semiconductor devices that use silicon carbide (hereinafter, silicon carbide semiconductor devices (SiC devices)), in power metal oxide semiconductor field effect transistors (MOSFET) and insulated gate bipolar transistors (IGBT), typically, a nickel silicide (NiSi) film is provided on a front surface of a semiconductor substrate to form an ohmic contact of a front electrode and the semiconductor substrate (for example, Japanese Laid-Open Patent Publication No. 2015-109474).

Further, in a traditional semiconductor device using silicon carbide, a titanium nitride film that becomes a barrier metal for suppressing the diffusion of aluminum (Al) from an aluminum film that is a front electrode is provided between the front electrode and an interlayer insulating film. For example, to suppress the diffusion of nickel (Ni) to an interlayer insulating film, from a nickel film that is a constituent material of a nickel silicide film and that is formed on a front surface of a semiconductor substrate, a method of forming a titanium nitride film to cover the interlayer insulating film before the nickel film is formed has been proposed.

A traditional method of manufacturing a silicon carbide semiconductor device will be described. First, a MOS gate structure is formed on a front surface side of a semiconductor substrate formed of silicon carbide (hereinafter, silicon carbide substrate). Next, an interlayer insulating film is formed on the front surface of the semiconductor substrate and the MOS gate structure is covered by the interlayer insulating film. The interlayer insulating film is patterned and a contact hole is formed whereby a contact (electrical contact portion) formation region of the silicon carbide substrate is exposed. Next, by sputtering or vapor deposition, a titanium nitride (TiN) film is formed along a surface of the interlayer insulating film and an inner wall of the contact hole.

The titanium nitride is partially removed by etching and the formation region for contact with the silicon carbide substrate is again exposed. Next, a nickel (Ni) film is formed along the surface of the titanium nitride film and the inner wall of the contact hole by sputtering or vapor deposition. The silicon carbide substrate and the nickel film are caused to react by heat treatment whereby at the contact hole, a nickel silicide film forming an ohmic contact is formed on the front surface of the silicon carbide substrate. Thereafter, a front electrode contacting the nickel silicide film is formed and a rear electrode is formed on a rear surface of the silicon carbide substrate whereby the SiC device is completed.

SUMMARY OF THE INVENTION

According to one aspect of the present invention a silicon carbide semiconductor device includes an insulated gate structure provided on a surface of a semiconductor substrate including silicon carbide; an insulating film covering the insulated gate structure; a contact hole penetrating the insulating film in a depth direction; a titanium nitride film provided so as to cover the insulating film; and a nickel silicide film provided on the surface of the semiconductor substrate in the contact hole and forming an ohmic contact with the semiconductor substrate. The titanium nitride film has a grain size that is 20 nm to 50 nm.

In the silicon carbide semiconductor device, the titanium nitride film has a crystal structure that is a columnar structure formed from columnar grains grown in a vertical direction on the surface of the semiconductor substrate and aligned along a horizontal direction on the surface of the semiconductor substrate.

According to another aspect of the present invention, a method of manufacturing a silicon carbide semiconductor device includes forming an insulated gate structure on a surface of a semiconductor substrate including silicon carbide; forming an insulating film on the surface of the semiconductor substrate so as to cover the insulated gate structure; forming a contact hole penetrating the insulating film in a depth direction so as to selectively expose the surface of the semiconductor substrate; forming a titanium nitride film on the surface of the semiconductor substrate so as to cover the insulating film; forming a nickel film on the surface of the semiconductor substrate exposed in the contact hole; and heat treating the semiconductor substrate and the nickel film to react and form a silicide, forming a nickel silicide film that forms an ohmic contact with the semiconductor substrate. The heat treating is performed so as to increase a grain size of the titanium nitride film so that interstices of grains of the titanium nitride film become smaller than before the heat treating or are eliminated.

In the method of manufacturing a silicon carbide semiconductor device, the heat treating is performed so as to make the grain size of the titanium nitride film to be 20 nm to 50 nm.

In the method of manufacturing a silicon carbide semiconductor device, the heat treating is rapid thermal annealing at a temperature of 800 degrees C. to 1100 degrees C.

In the method of manufacturing a silicon carbide semiconductor device, the nickel film is formed so as to extend on the titanium nitride film from the surface of the semiconductor substrate exposed in the contact hole, and the method further includes removing after the heat treating, a first portion of the nickel film excluding a second portion of the nickel film forming the silicide.

In the method of manufacturing a silicon carbide semiconductor device, subsequent heat treating after the heat treating to form the silicide is at a temperature of 400 degrees C. or lower.

Objects, features, and advantages of the present invention are specifically set forth in or will become apparent from the following detailed description of the invention when read in conjunction with the accompanying drawings.

DETAILED DESCRIPTION OF THE INVENTION

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
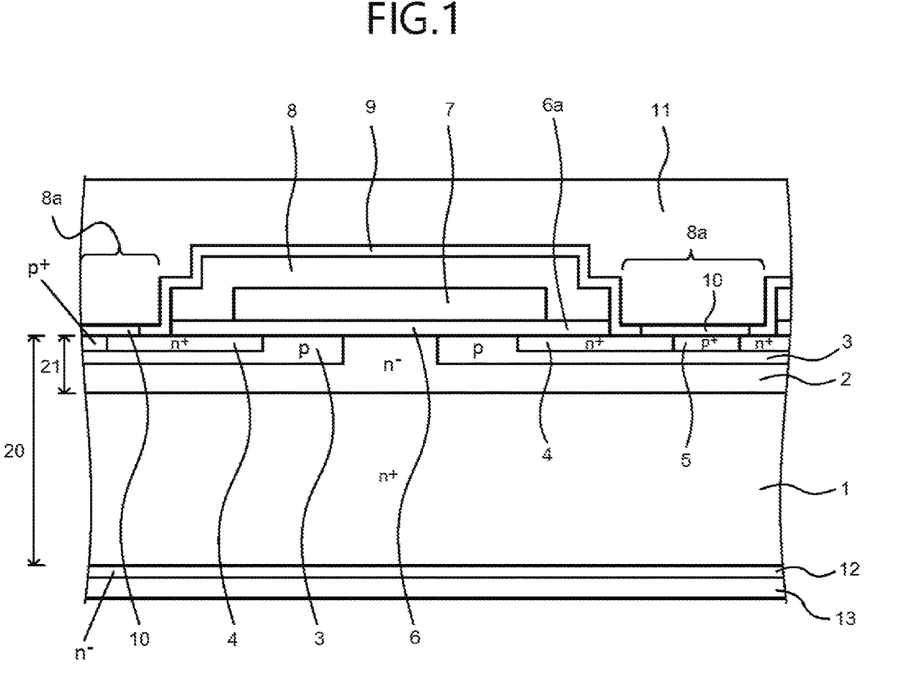
FIG. 1 is a cross-sectional view of a structure of a silicon carbide semiconductor device according to an embodiment.

A structure of a silicon carbide semiconductor device according to an embodiment will be described taking a vertical MOSFET as an example. FIG. 1 is a cross-sectional view of a structure of the silicon carbide semiconductor device according to the embodiment. In FIG. 1, an active region that bears driving current (region through which current flows in an on-state) is depicted for one unit cell (semiconductor element functional unit), and other unit cells arranged adjacent to this unit cell and an edge termination structure arranged in an edge termination region are omitted from the drawing. The edge termination region is a region that surrounds a periphery of the active region and mitigates the electric field of a front surface side of a base front surface side of an $n^-$-type drift region 2 to maintain the breakdown voltage.

The silicon carbide semiconductor device according to the embodiment and depicted in FIG. 1 is a vertical MOSFET having a MOS gate structure of a planar gate structure on a front surface side ($n^-$-type drift region 2 side) of a silicon carbide base (semiconductor chip) 20. The silicon carbide base 20 is an epitaxial growth substrate (semiconductor substrate) formed by forming an $n^-$-type silicon carbide layer 21 by epitaxial growth to become an $n^-$-type drift region 2 on a front surface of an $n^+$-type supporting substrate ($n^+$-type silicon carbide substrate) 1 that becomes an $n^+$-type drain region. In a surface layer on an opposite side of the $n^-$-type silicon carbide layer 21 (becoming the $n^-$-type drift region 2) from an $n^+$-type silicon carbide substrate 1 side thereof, p-type base regions 3 are selectively provided.

In the p-type base regions 3, $n^+$-type source regions 4 and $p^+$-type contact regions 5 are selectively provided. A portion of the $n^-$-type silicon carbide layer 21 other than the p-type base regions 3, the $n^+$-type source regions 4, and the $p^+$-type contact regions 5 is the $n^-$-type drift region 2. On a surface of the p-type base regions 3, at a portion between the $n^-$-type drift region 2 and the $n^+$-type source regions 4, a gate insulating film 6 is provided passing over the $n^-$-type drift region 2. On the gate insulating film 6, a gate electrode 7 is provided. The p-type base regions 3, the $n^+$-type source regions 4, the $p^+$-type contact regions 5, the gate insulating film 6, and the gate electrode 7 constitute the MOS gate structure.

An interlayer insulating film 8 is provided on the entire front surface of the silicon carbide base 20 and covers the gate electrode 7. A titanium nitride (TiN) film 9 is provided on the entire surface of the interlayer insulating film 8, covering the interlayer insulating film 8. Further, at a contact hole 8a, the titanium nitride film 9 extends onto the front surface of the silicon carbide base 20 and covers an end 6a of the gate insulating film 6. By providing the titanium nitride film 9 in this way, the gate insulating film 6 and the interlayer insulating film 8 do not contact a first nickel silicide (NiSi) film 10 described hereinafter. The titanium nitride film 9 functions as a barrier metal that prevents diffusion of metal from the first nickel silicide film 10 and a front electrode 11 described hereinafter to the interlayer insulating film 8 side.

A crystal structure of the titanium nitride film 9 is a columnar structure formed from columnar grains grown in a vertical direction from the substrate front surface and these grains are aligned along a horizontal direction on the substrate front surface. A grain size of the titanium nitride film, for example, is about 20 nm or more and 50 nm or less. Since the grain size of the titanium nitride film 9 is about 20 nm to 50 nm, interstices of the grains of the titanium nitride film 9 are smaller than those of a traditional structure (refer to FIGS. 8 and 9) or are absent. The grain size of the titanium nitride film 9, for example, may be preferably about 40 nm or less and more preferably, about 30 nm or less. The smaller grain size of the titanium nitride film 9 enables suppression of peeling between grains of the titanium nitride film 9 and makes cracks in the titanium nitride film 9 less likely to occur.

In the contact hole 8a, the nickel silicide film (hereinafter, first nickel silicide film) 10 is provided on the front surface of the silicon carbide base 20. The first nickel silicide film 10 is provided only on the front surface of the silicon carbide base 20 in the contact hole 8a, and contacts the $n^+$-type source regions 4 and the $p^+$-type contact regions 5. The first nickel silicide film 10 forms an ohmic contact (electrical contact portion) with the silicon carbide base 20. The first nickel silicide film 10 terminates on the front surface of the silicon carbide base 20 in the contact hole 8a and contacts the titanium nitride film 9.

On a surface of the titanium nitride film 9 and the first nickel silicide film 10, the front electrode 11 is provided so as to be embedded in the contact hole 8a. The front electrode 11 is electrically connected to the $n^+$-type source regions 4 and the $p^+$-type contact regions 5, via the first nickel silicide film 10, functions as a source electrode, and is electrically insulated from the gate electrode 7 by the interlayer insulating film 8. On the entire rear surface of the silicon carbide base 20 (rear surface of the $n^+$-type silicon carbide substrate 1), a nickel silicide film (hereinafter, second nickel silicide film) 12 is provided. The second nickel silicide film 12 forms an ohmic contact with the silicon carbide base 20. On the surface of the second nickel silicide film 12, a rear electrode 13 is provided. The rear electrode 13 functions as a drain electrode.

Figure 2:
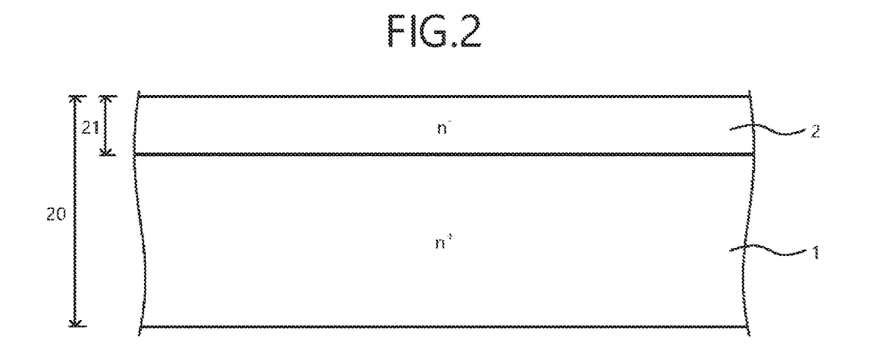
FIGS. 2, 3, 4, 5, 6, and 7 are cross-sectional views of the silicon carbide semiconductor device during manufacture according to the embodiment.

A method of manufacturing a silicon carbide semiconductor device according to the embodiment will be described. FIGS. 2, 3, 4, 5, 6, and 7 are cross-sectional views of the silicon carbide semiconductor device during manufacture according to the embodiment. As depicted in FIG. 2, the $n^+$-type silicon carbide substrate 1 that becomes the $n^+$-type drain region is prepared. On the front surface of the $n^+$-type silicon carbide substrate 1, the $n^-$-type silicon carbide layer 21 that becomes the $n^-$-type drift region 2, for example, is formed by epitaxial growth to have a thickness of 15 μm. By the processes up to here, the silicon carbide base 20 is formed that is an epitaxial substrate where the $n^-$-type silicon carbide layer 21 is deposited (formed) on the $n^+$-type silicon carbide substrate 1.

Figure 3:
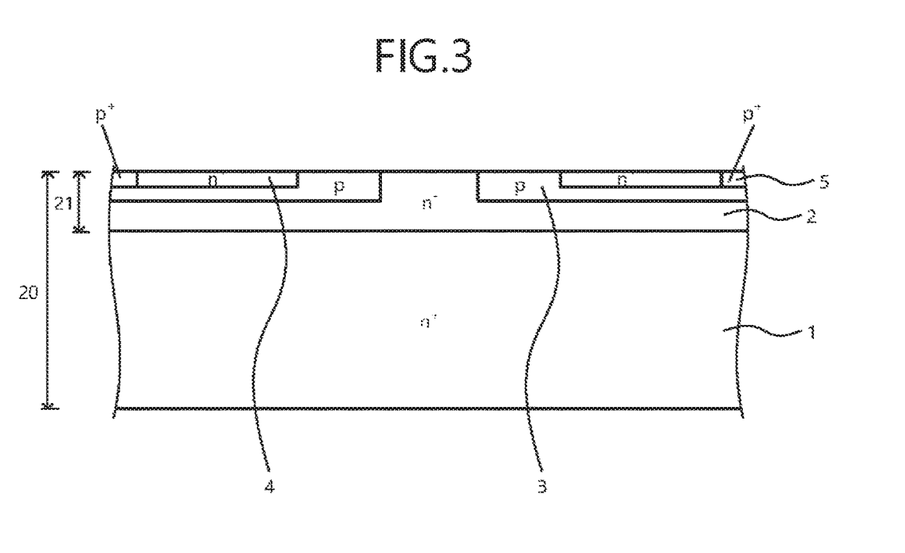

As depicted in FIG. 3, by ion implantation, the p-type base regions 3 are selectively formed in the surface layer of the $n^-$-type silicon carbide layer 21. Next, ion implantation is repeatedly performed under different conditions to form the $n^+$-type source regions 4 and the $p^+$-type contact regions 5 in the p-type base regions 3. Heat treatment at a temperature of, for example, about 1800 degrees C. is performed to activate the regions formed by the ion implantations. The heat treatment for activation may be performed for each formation of a region by ion implantation. A portion of the $n^-$-type silicon carbide layer 21 other than the p-type base regions 3, the $n^+$-type source regions 4, and the $p^+$-type contact regions 5 becomes the $n^-$-type drift region 2.

Figure 4:
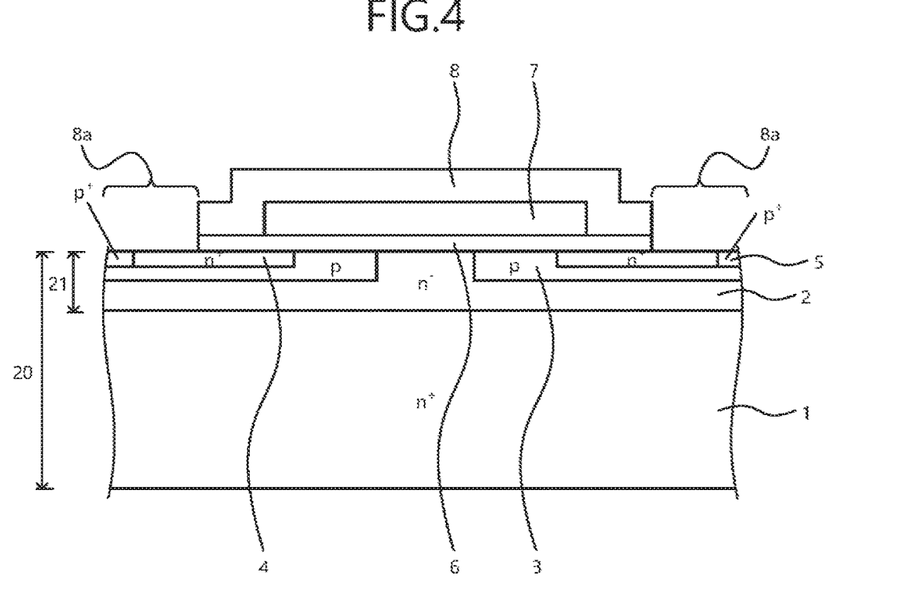

Next, as depicted in FIG. 4, the gate insulating film 6 is formed on the front surface (surface on the $n^-$-type silicon carbide layer 21 side) of the silicon carbide base 20. Poly-silicon (poly-Si) doped with an impurity is deposited on the gate insulating film 6 and patterned whereby poly-silicon remains to become the gate electrode 7. The interlayer insulating film 8 is formed on the entire surface of the silicon carbide base 20 so as to cover the gate electrode 7. The interlayer insulating film 8 and the gate insulating film 6 are patterned, the contact hole 8a is formed, and the $n^+$-type source regions 4 and the $p^+$-type contact regions 5 are exposed.

Figure 5:
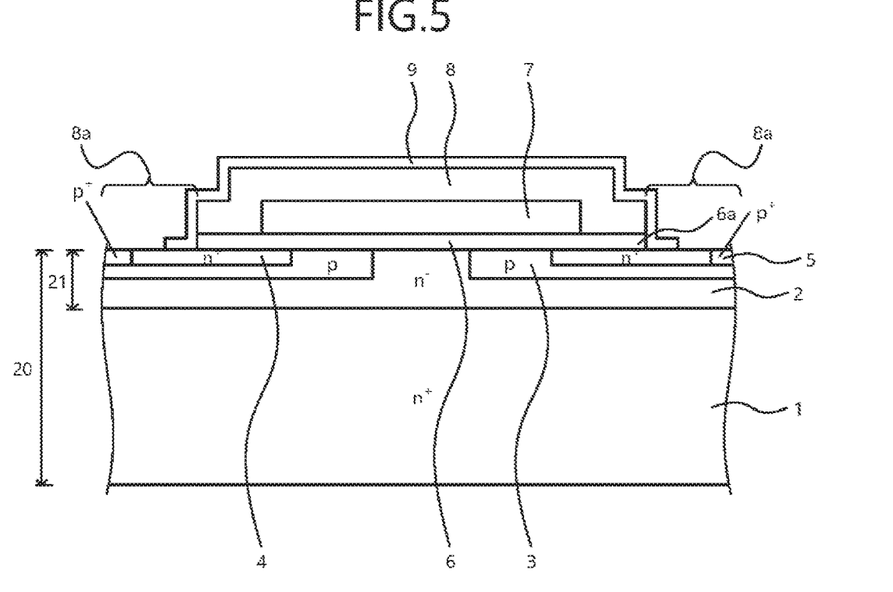

Next, as depicted in FIG. 5, the titanium nitride film 9 is formed along the surface of the interlayer insulating film 8 and the inner wall of the contact hole 8a, for example, by sputtering. The sputtering of the titanium nitride film 9, for example, may be performed under conditions of heating the silicon carbide base 20 to a temperature (temperature of the base) of about 200 degrees C. or higher and 400 degrees C. or lower and a gas atmosphere of a pressure of about 0.15 Pa or higher and 0.4 Pa or lower. At this time, the grain size of the titanium nitride film 9, for example, is about less than 20 nm, and between the grains of the titanium nitride film 9, interstices about the same as those in a traditional structure (refer to FIG. 8) are generated.

A thickness of the titanium nitride film 9 may be preferably about 50 nm or more and 150 nm or less. The reason for this is as follows. When the thickness of the titanium nitride film 9 exceeds 150 nm, cracks are generated in the titanium nitride film 9 during heat treatment thereafter due to a difference of the coefficient of thermal expansion relative to the interlayer insulating film 8. When the thickness of the titanium nitride film 9 is less than 50 nm, coating defects occur such as the thickness of the titanium nitride film 9 becoming thin at portions, the interlayer insulating film 8 not being covered by the titanium nitride film 9 and being partially exposed, and the like.

Next, the titanium nitride film 9 is patterned and the $n^+$-type source regions 4 and the $p^+$-type contact regions 5 are again exposed in the contact hole 8a. Here, the titanium nitride film 9 may remain so as to extend on the front surface of the silicon carbide base 20 exposed in the contact hole 8a. As a result, at a side wall of the contact hole 8a, the end 6a of the gate insulating film 6 is covered by the titanium nitride film 9. Therefore, diffusion of metal from a first nickel (Ni) film 31 described hereinafter and the front electrode 11 to the gate electrode 7 side via the end 6a of the gate insulating film 6 may be prevented.

Figure 6:
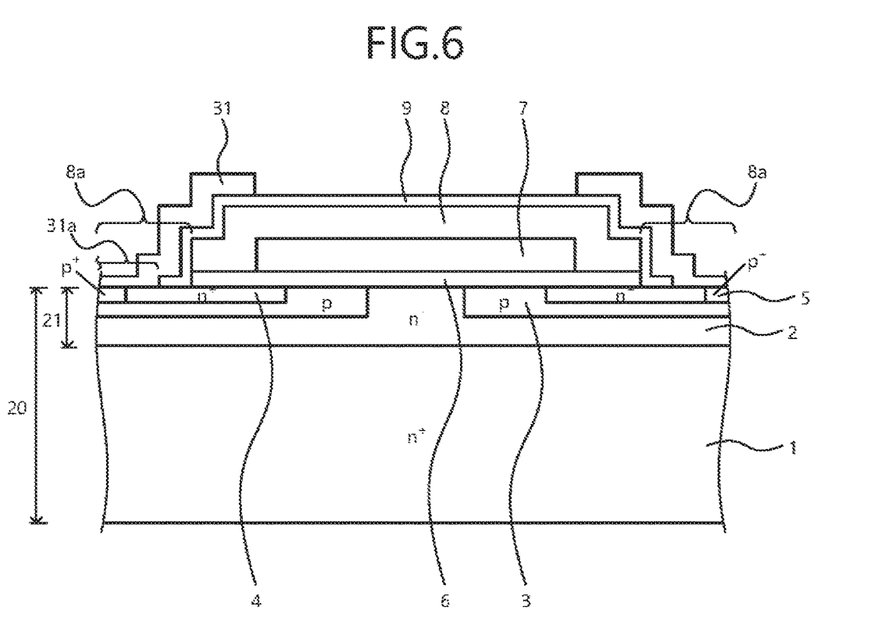

Next, as depicted in FIG. 6, along the surface of the titanium nitride film 9 and the inner wall of the contact hole 8a, the first nickel film 31 is formed, for example, by sputtering, to have a thickness of, for example, 60 nm. The sputtering of the first nickel film 31, for example, may be magnetron sputtering performed under conditions of the temperature of the base being room temperature RT (for example, about 25 degrees C.), and an argon (Ar) gas atmosphere of a pressure of about 0.3 Pa. The first nickel film 31 is patterned so that a portion 31a of the first nickel film 31 on the front surface of the silicon carbide base 20 remains so as to extend on the titanium nitride film 9.

By leaving the first nickel film 31 so as to extend on the titanium nitride film 9 from the portion 31a on the front surface of the silicon carbide base 20, the first nickel film 31 may be left to remain such that gaps do not form between the first nickel film 31 and the titanium nitride film 9 even when etching variation occurs. As a result, at subsequent processes, the first nickel silicide film 10 is formed on the entire front surface (opening portion of the titanium nitride film 9) of the silicon carbide base 20 exposed in the contact hole 8a. Therefore, a decrease in the area of the ohmic contact may be prevented.

Figure 7:
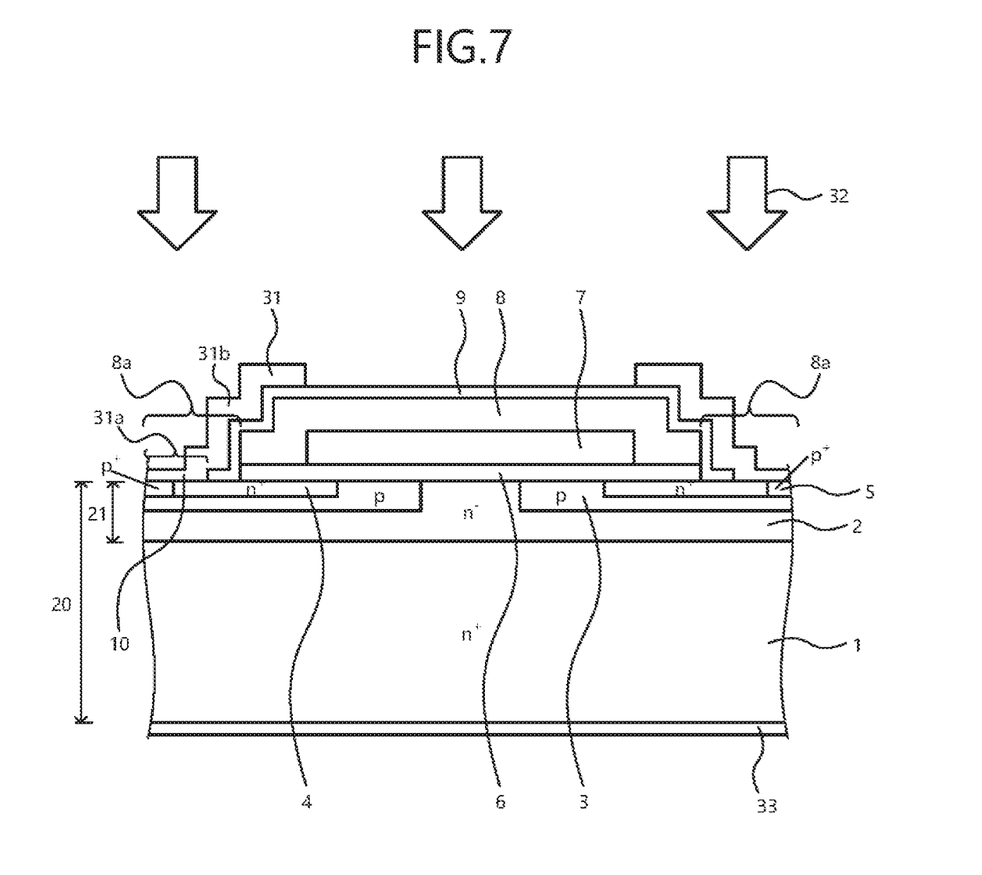

Next, as depicted in FIG. 7, for example, by rapid thermal annealing (RTA) 32 of a temperature about 800 degrees C. or higher and 1100 degrees or lower, the silicon carbide base 20 and the first nickel film 31 are caused to react and form a silicide. As a result, the portion 31a of the first nickel film 31 on the front surface of the silicon carbide base 20 is converted into a silicide, and the first nickel silicide film 10 forming an ohmic contact with the silicon carbide base 20 is formed. A portion 31b of the first nickel film 31 on the titanium nitride film 9 is not in contact with the silicon carbide base 20 and thus, is not converted into a silicide and remains as it is. Therefore, the portion 31b is removed before the front electrode 11 described hereinafter is formed.

Further, by the rapid thermal annealing 32 for forming this ohmic contact, the grains of the titanium nitride film 9 are enlarged and the grain size of the titanium nitride film 9 is made larger than the state before the rapid thermal annealing 32. As a result, interstices of the grains of the titanium nitride film 9 may be made smaller than those at a state before the rapid thermal annealing 32 or may be eliminated. Therefore, during the rapid thermal annealing 32 for forming the ohmic contact, the intrusion of nickel between the columnar grains of the titanium nitride film 9 from the first nickel film 31 on the titanium nitride film 9 may be suppressed. As a result, it becomes possible to suppress nickel from penetrating the interlayer insulating film 8 (the layer beneath the titanium nitride film 9) from the first nickel film 31.

In particular, the grain size of the titanium nitride film 9, for example, is made to be about 20 nm or more and 50 nm or less by the rapid thermal annealing 32. The reason for this is as follows. When the grain size of the titanium nitride film 9 is less than 20 nm, the conversion of the first nickel film 31 into a silicide is insufficient and thus, a low contact resistance by the ohmic contact may not be sufficiently achieved. When the grain size of the titanium nitride film 9 exceeds 50 nm, the grains of the titanium nitride film 9 become too large whereby peeling between grains of the titanium nitride film 9 occurs and cracks in the titanium nitride film 9 occur.

The grain size of the titanium nitride film 9, for example, is determined by the sputtering conditions (pressure and temperature of the gas atmosphere, added amount of nitrogen gas, and the like) for forming the titanium nitride film 9. Therefore, the sputtering conditions for forming the titanium nitride film 9 are determined so that the grain size of the titanium nitride film 9 is within the range above after the rapid thermal annealing 32. For example, by forming the titanium nitride film 9 under the above sputtering conditions, the grain size of the titanium nitride film 9 becomes about 20 nm or more and 50 nm or less after the rapid thermal annealing 32 as described above.

Next, a second nickel film 33 is formed on the entire surface of the rear surface (rear surface of the n$^+$-type silicon carbide substrate 1) of the silicon carbide base 20. A method of forming the second nickel film 33, for example, is the same as the method of forming the first nickel film 31. The second nickel film 33 of the rear surface of the silicon carbide base 20 is converted into a silicide, forming the second nickel silicide film 12 on the rear surface of the silicon carbide base 20. A method of forming the second nickel silicide film 12, for example, is the same as the method of forming the first nickel silicide film 10. The first and second nickel films 31, 33 may be formed simultaneously on both surfaces of the silicon carbide base 20. The first and second nickel silicide films 10, 12 may be formed simultaneously on both surfaces of the silicon carbide base 20.

Next, a titanium (Ti) film and an aluminum (Al) film are formed continuously in this order by sputtering, as the front electrode 11 (See FIG. 1). The sputtering of the metal films constituting the front electrode 11, for example, may be magnetron sputtering performed under conditions of the temperature of the base being about 250 degrees C. and an argon gas atmosphere having a pressure of about 0.3 Pa. Thicknesses of the titanium film and the aluminum film constituting the front electrode 11, for example, may be about 0.1 μm and about 5.0 μm, respectively.

Further, at the time of sputtering, the thickness of the titanium film constituting the front electrode 11, for example, may be preferably about 1.0 μm or less. The reason for this is that since titanium is a hard metal, when a thickness t11 of the titanium film is thicker than 1.0 μm, cracks occur in the titanium film. Next, the front electrode 11 is patterned and a portion to become the source electrode is left. Next, on the front surface side of the silicon carbide base 20, a polyimide film (not depicted) to become a passivation protective film is formed and, for example, is hardened (cured) by heat treatment (annealing) at a temperature of 380 degrees C.

By the heat treatment for hardening the passivation protective film, or by heat treatment thereafter, formation of an alloy at an interface of the titanium film and the aluminum film constituting the front electrode 11 proceeds, and an alloy film (hereinafter, TiAl alloy film (not depicted)) including titanium and aluminum is formed between the titanium film and the aluminum film. In this manner, even when the TiAl alloy film is formed between the titanium film and the aluminum film constituting the front electrode 11, the titanium film is left to remain over the entire surfaces of the titanium nitride film 9 and the first nickel silicide film 10.

Therefore, hydrogen atoms/hydrogen ions generated from inside the aluminum film constituting the front electrode 11 are occluded in the titanium film below and do not move to layers below the titanium film (to the silicon carbide base 20 side). As a result, hydrogen atoms/hydrogen ions in the aluminum film constituting the front electrode 11 do not diffuse to the gate insulating film 6. Therefore, it is possible to obtain the gate insulating film 6 that has a stable gate threshold voltage. The hydrogen atoms/hydrogen ions are particles having hydrogen atoms as the smallest constituent unit and in particular, are hydrogen atoms, hydrogen ions, and hydrogen molecules.

For example, the thickness of the TiAl alloy film formed between the titanium film and the aluminum film constituting the front electrode 11 is about 10 nm or less, and the thickness of the titanium film remaining in the layer below may be about 90 nm. The inventor confirmed that by such a structure, under high-temperature operation where the operating temperature (junction temperature) becomes 200 degrees C., the amount of variation of the gate threshold voltage after negative voltage of −3 MV/cm was applied to the gate electrode 7 for 1000 hours could be suppressed to ±0.1V or less.

Further, to obtain the occlusion effect of hydrogen atoms/hydrogen ions by the titanium film constituting the front electrode 11, the thickness of the titanium film remaining after heat treatment has to be about 10 nm or more as described. Results of verification of the concentration of the hydrogen molecules occluded in the titanium film confirmed that when the thickness of the titanium film is 100 nm and hydrogen is injected at 400 degrees C., the concentration of the hydrogen molecules occluded in the titanium film is $6 \times 10^{17}/cm^2$. Therefore, by setting the thickness of the titanium film remaining after heat treatment to be 10 nm or more as described, it becomes possible to set the concentration of the hydrogen molecules occluded in the titanium film to be $1 \times 10^{15}/cm^2$ or higher.

Further, to set the thickness of the titanium film remaining after heat treatment to be 10 nm or more, the thickness of the TiAl alloy film formed by reacting the titanium film and the aluminum film thereabove, for example, may be preferably kept about 1 nm or more and 50 nm or less. For example, the inventor confirmed that when the temperature of the heat treatment performed after the formation of the front electrode 11 is 400 degrees C. or higher, the thickness of the TiAl alloy film becomes 50 nm or more, and when the temperature of the heat treatment is about 380 degrees C., the thickness of the TiAl alloy film is 10 nm or less. Therefore, the heat treatment performed after the formation of the front electrode 11, for example, may be preferably about 400 degrees C. or lower.

Next, the rear electrode 13 is formed on the surface of the second nickel silicide film 12 whereby the vertical MOSFET depicted in FIG. 1 is completed.

As described, according to the embodiment, the grain size of the titanium nitride film formed between the nickel film and the interlayer insulating film is increased to about 20 nm or more and 50 nm or less by the rapid thermal annealing for forming the ohmic contact of the silicon carbide base and the nickel film. As a result, during the rapid thermal annealing, the intrusion of nickel from the nickel film into spaces between the columnar grains of the titanium nitride film may be suppressed whereby further penetration of nickel into the interlayer insulating film below the titanium nitride film may be suppressed. Therefore, decreases in the dielectric strength of the interlayer insulating film and decreases in semiconductor element reliability may be suppressed, enabling favorable element characteristics. Further, according to embodiment, similar to a traditional structure (refer to FIG. 8), provision of the titanium nitride film so as to cover the interlayer insulating film is possible and therefore, interaction between the front electrode and the interlayer insulating film, which face each other via the titanium nitride film, may be prevented.

The present invention is not limited to the above embodiments and various variations are possible within a range not departing from the spirit of the invention. For example, in the embodiments above, a vertical MOSFET has been described as an example; however, the invention is applicable to other silicon carbide semiconductor devices such as an IGBT. Further, similar effects are obtained in a case where in place of a planar gate structure, a trench gate structure is adopted. Similar effects are further obtained in a case where rapid thermal annealing is performed to convert the first nickel film into a silicide in a state with the entire surface of the titanium nitride film covered by the first nickel film, without patterning of the first nickel film. In each embodiment, a first conductivity type is regarded as an n-type and a second conductivity type is regarded as a p-type; however, the present invention is similarly applicable when the first conductivity type is a p-type and the second conductivity type is an n-type.

Figure 8:
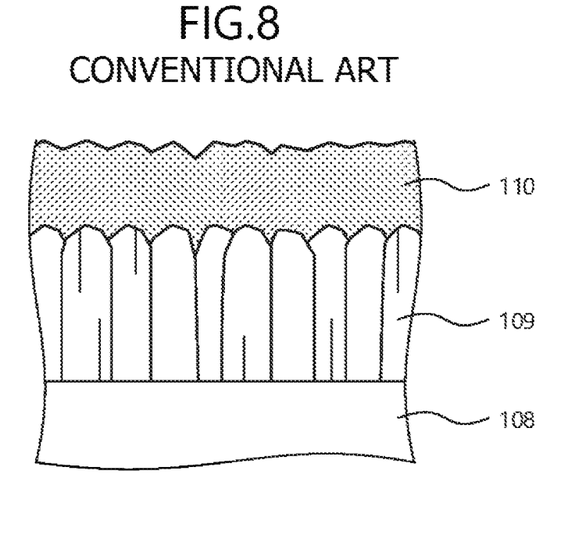
FIGS. 8 and 9 are cross-sectional views of a traditional silicon carbide semiconductor device during manufacture.
Figure 9:
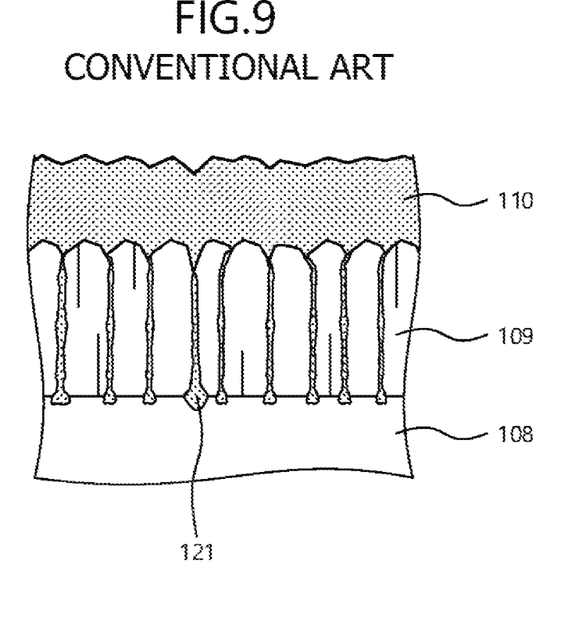

In contrast, traditionally, in forming a nickel silicide film by reacting a silicon carbide substrate (not depicted) and a nickel film, rapid thermal annealing (RTA) at a temperature of 800 degrees C. or higher has to be performed. FIGS. 8 and 9 are cross-sectional views of a traditional silicon carbide semiconductor device during manufacture. FIGS. 8 and 9 respectively depict a titanium nitride film 109 before and after rapid thermal annealing for forming an ohmic contact. During this rapid thermal annealing, to prevent the diffusion of nickel from a nickel film 110 to an interlayer insulating film 108, the titanium nitride film 109 is formed between the nickel film 110 and the interlayer insulating film 108 as depicted in FIG. 8.

A crystal structure of the titanium nitride film 109 is a columnar structure of columnar grains grown in a vertical direction on the substrate front surface. Grains of the titanium nitride film 109 are present discontinuously in a horizontal direction on the substrate front surface and interstices of the grains are generated. Therefore, with the traditional technique described above, as depicted in FIG. 9, consequent to the rapid thermal annealing, nickel 121 from the nickel film 110 on the titanium nitride film 109 intrudes between the columnar grains of the titanium nitride film 109, reaches the interlayer insulating film 108, and penetrates the interlayer insulating film 108. Consequently, even when the titanium nitride film 109 is provided between the nickel film 110 and the interlayer insulating film 108, the nickel cannot be completely prevented from penetrating the interlayer insulating film 108 from the nickel film 110. As a result, problems arise such as the dielectric strength of the interlayer insulating film 108 decreasing, the semiconductor element reliability decreasing, and the like.

According to the present invention, during the rapid thermal annealing, the intrusion of nickel between the columnar grains of the titanium nitride film from the nickel film may be suppressed whereby the nickel may be suppressed from penetrating the insulating film beneath the titanium nitride film. Therefore, decreases in the dielectric strength of the insulating film and decreases in the semiconductor element reliability may be suppressed.

The silicon carbide semiconductor device and the method of manufacturing a silicon carbide semiconductor device according to the present invention achieve an effect of enabling favorable element characteristics to be obtained.

As described, the silicon carbide semiconductor device and the method of manufacturing a silicon carbide semiconductor device according to the present invention are useful for power semiconductor devices used in power supply devices for inverters and switching.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device comprising:
   an insulated gate structure provided on a surface of a semiconductor substrate including silicon carbide;
   an insulating film covering the insulated gate structure;
   a contact hole penetrating the insulating film in a depth direction;
   a titanium nitride film provided so as to cover the insulating film; and
   a nickel silicide film provided on the surface of the semiconductor substrate in the contact hole and forming an ohmic contact with the semiconductor substrate, wherein
   the titanium nitride film has a grain size that is larger than 20 nm and smaller than or equal to 50 nm,
   the titanium nitride film has a crystal structure that is a columnar structure formed from columnar grains grown in a vertical direction on the surface of the semiconductor substrate, where the surface of the semiconductor substrate defines a horizontal direction, and
   wherein the titanium nitride film forms a layer in the horizontal direction on the surface of the semiconductor substrate.

2. A method of manufacturing a silicon carbide semiconductor device, the method comprising:
   forming an insulated gate structure on a surface of a semiconductor substrate including silicon carbide;
   forming an insulating film on the surface of the semiconductor substrate so as to cover the insulated gate structure;
   forming a contact hole penetrating the insulating film in a depth direction so as to selectively expose the surface of the semiconductor substrate;
   forming a titanium nitride film on the surface of the semiconductor substrate so as to cover the insulating film;
   forming a nickel film on the surface of the semiconductor substrate exposed in the contact hole; and
   heat treating the semiconductor substrate and the nickel film to react and form a nickel silicide film that forms an ohmic contact with the semiconductor substrate, wherein
   the heat treating is performed so as to increase a grain size of the titanium nitride film so that interstices of grains of the titanium nitride film become smaller than before the heat treating or are eliminated.

3. The method of manufacturing a silicon carbide semiconductor device according to claim 2, wherein
   the heat treating is performed so as to make the grain size of the titanium nitride film to be 4 nm to 50 nm.

4. The method of manufacturing a silicon carbide semiconductor device according to claim 2, wherein
   the heat treating is rapid thermal annealing at a temperature of 800 degrees C. to 1100 degrees C.

5. The method of manufacturing a silicon carbide semiconductor device according to claim 2, wherein
the nickel film is formed so as to extend from the surface of the semiconductor substrate exposed in the contact hole onto a portion of the titanium nitride film, and
the method further comprises removing, after the heat treating, a first portion of the nickel film excluding a second portion of the nickel film forming the silicide.

6. The method of manufacturing a silicon carbide semiconductor device according to claim 2, wherein
subsequent heat treating after the heat treating to form the silicide is at a temperature of 400 degrees C. or lower.

\* \* \* \* \*